(12) United States Patent
Ren et al.

(10) Patent No.: US 8,299,546 B2
(45) Date of Patent: Oct. 30, 2012

(54) SEMICONDUCTOR DEVICES WITH VERTICAL EXTENSIONS FOR LATERAL SCALING

(75) Inventors: Zhibin Ren, Hopewell Junction, NY (US); Kevin K. Chan, Staten Island, NY (US); Chung-Hsun Lin, White Plains, NY (US); Xinhui Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 12/731,481

(22) Filed: Mar. 25, 2010

(65) Prior Publication Data
US 2011/0233688 A1    Sep. 29, 2011

(51) Int. Cl.
*H01L 21/86* (2006.01)
*H01L 21/8238* (2006.01)

(52) U.S. Cl. ........... 257/408; 257/403; 257/E21.119; 257/E29.264; 257/E29.27; 257/E29.267; 438/217; 438/221; 438/231

(58) Field of Classification Search .............. None
See application file for complete search history.

(56) References Cited

U.S. PATENT DOCUMENTS

| | | | |
|---|---|---|---|
| 4,764,799 A | 8/1988 | Malaviya | |
| 6,083,836 A * | 7/2000 | Rodder | 438/690 |
| 6,303,418 B1 | 10/2001 | Cha et al. | |
| 7,473,947 B2 * | 1/2009 | Murthy et al. | 257/288 |
| 7,652,332 B2 * | 1/2010 | Cartier et al. | 257/347 |
| 2006/0157797 A1 * | 7/2006 | Tateshita | 257/369 |
| 2006/0252191 A1 * | 11/2006 | Kammler et al. | 438/197 |
| 2007/0164360 A1 * | 7/2007 | Morooka et al. | 257/347 |
| 2008/0217686 A1 * | 9/2008 | Majumdar et al. | 257/347 |
| 2009/0134468 A1 * | 5/2009 | Tsuchiya et al. | 257/368 |
| 2009/0289305 A1 * | 11/2009 | Majumdar et al. | 257/351 |

OTHER PUBLICATIONS

Cheng, K., et. al, "Fully depleted extremely thin SOI technology fabricated by a novel integration scheme featuring implant-free, zero-silicon-loss, and faceted raised source/drain," VLSI Technology, 2009 Symposium on , vol., no., pp. 212-213, Jun. 16-18, 2009.*
Hellings, G. et. al. "Implant-Free SiGe Quantum Well pFET: A novel, highly scalable and low thermal budget device, featuring raised source/drain and high-mobility channel," Electron Devices Meeting (IEDM), 2010 IEEE International , vol., no., pp. 10.4.1-10.4.4, Dec. 6-8, 2010.* Cheng, K., et. al, "Extremely thin SOI (ETSOI) CMOS with record low variability for low power system-on-chip applications," Electron Devices Meeting (IEDM), 2009 IEEE International , vol., no., pp. 1-4, Dec. 7-9, 2009.*
Trivedi, V.P., and J.G. Fossum. "Scaling Fully Depleted SOI CMOS." IEEE Transactions on Electron Devices 50.10 (2003): 2095-103.*
Challenges and Solutions of Extremely Thin SOI (ETSOI) for CMOS Scaling to 22nm Node and Beyond Kangguo Cheng, et. al ECS Trans. 27, 951 (2010).*

* cited by examiner

*Primary Examiner* — Victor A Mandala
*Assistant Examiner* — Joseph Schoenholtz
(74) *Attorney, Agent, or Firm* — Scully, Scott, Murphy & Presser, P.C.; H. Daniel Schnurmann

(57) ABSTRACT

A method of forming a semiconductor device is provided, in which extension regions are formed atop the substrate in a vertical orientation. In one embodiment, the method includes providing a semiconductor substrate doped with a first conductivity dopant. Raised extension regions are formed on first portions of the semiconductor substrate that are separated by a second portion of the semiconductor substrate. The raised extension regions have a first concentration of a second conductivity dopant. Raised source regions and raised drain regions are formed on the raised extension regions. The raised source regions and the raised drain regions each have a second concentration of the second conductivity dopant, wherein the second concentration is greater than the first concentration. A gate structure is formed on the second portion of the semiconductor substrate.

16 Claims, 4 Drawing Sheets

US 8,299,546 B2

SEMICONDUCTOR DEVICES WITH VERTICAL EXTENSIONS FOR LATERAL SCALING

BACKGROUND

The present disclosure relates generally to semiconductor devices. More particularly, the present disclosure relates to scaling of semiconductor devices.

Semiconductor devices are the basic building block of today's integrated circuits (ICs). Such semiconductor devices can be formed in conventional bulk semiconductor substrates (such as silicon) or in an SOI layer of a semiconductor-on-insulator (SOI) substrate. In order to be able to make ICs, such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in semiconductor devices by shrinking the overall dimensions and operating voltages of the device, while maintaining the device's electrical properties.

SUMMARY

A method of forming a semiconductor device is provided, in which extension regions are formed atop the substrate in a vertical orientation. In one embodiment, the method includes providing a semiconductor substrate doped with a first conductivity dopant. Raised extension regions are formed on first portions of the semiconductor substrate that are separated by a second portion of the semiconductor substrate. The raised extension regions have a first concentration of a second conductivity dopant. Raised source regions and raised drain regions are formed on the raised extension regions. The raised source regions and the raised drain regions each have a second concentration of the second conductivity dopant, wherein the second concentration is greater than the first concentration. A gate structure is formed on the second portion of the semiconductor substrate. The gate structure may include a gate dielectric layer and a gate conductor, wherein the gate dielectric layer is positioned between the semiconductor substrate and a base of a gate conductor. The gate dielectric layer is also present on sidewalls of the gate conductor.

In another embodiment, a method for forming a CMOS semiconductor device is provided. The method may begin with providing a semiconductor substrate doped with a first conductivity dopant in a first device region and doped with a second conductivity dopant in a second device region. A first mask is formed on the second device region, leaving the first device region exposed. Second conductivity raised extension regions are formed on a first portion of the semiconductor substrate in the first device regions, in which the second conductivity raised extension regions have a first concentration of second conductivity dopant. Second conductivity raised source regions and second conductivity raised drain regions are formed on the second conductivity raised extension regions. The second conductivity raised source regions and the second conductivity raised drain regions each have a second concentration of the second conductivity dopant that is greater than the first concentration of second conductivity dopant that is in the second conductivity raised extension regions. The first mask is removed.

A second mask is formed on the first device region, leaving the second device region exposed. First conductivity raised extension regions are formed on a first portion of the semiconductor substrate in the second device region, in which the first conductivity raised extension regions have a third concentration of first conductivity dopant. First conductivity raised source regions and first conductivity raised drain regions are formed on the first conductivity raised extension regions. The first conductivity raised source regions and the first conductivity raised drain regions each have a fourth concentration of the first conductivity dopant that is greater than the third concentration of first conductivity dopant in the first conductivity raised extension regions.

Gate structures are formed on second portions of the semiconductor substrate. The second portions of the semiconductor substrate are between the first portions of the semiconductor substrate in the first device region and the second device region.

In another aspect, a semiconductor device is provided. In one embodiment, the semiconductor device includes a semiconductor substrate including at least one surface having a first conductivity type. A gate structure is present on the at least one surface of the semiconductor substrate, wherein the gate structure includes a gate dielectric layer that is positioned between the semiconductor substrate and a base of a gate conductor. The gate dielectric layer is also present on sidewalls of the gate conductor. Raised extension regions of a second conductivity type are present on a portion of the semiconductor substrate that is adjacent to the gate structure, in which the raised extension regions have a first dopant concentration. The semiconductor device also includes raised source regions and raised drain regions of a second conductivity type that are present on the raised extension regions. The raised source regions and raised drain regions have a second dopant concentration that is greater than the first dopant concentration.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
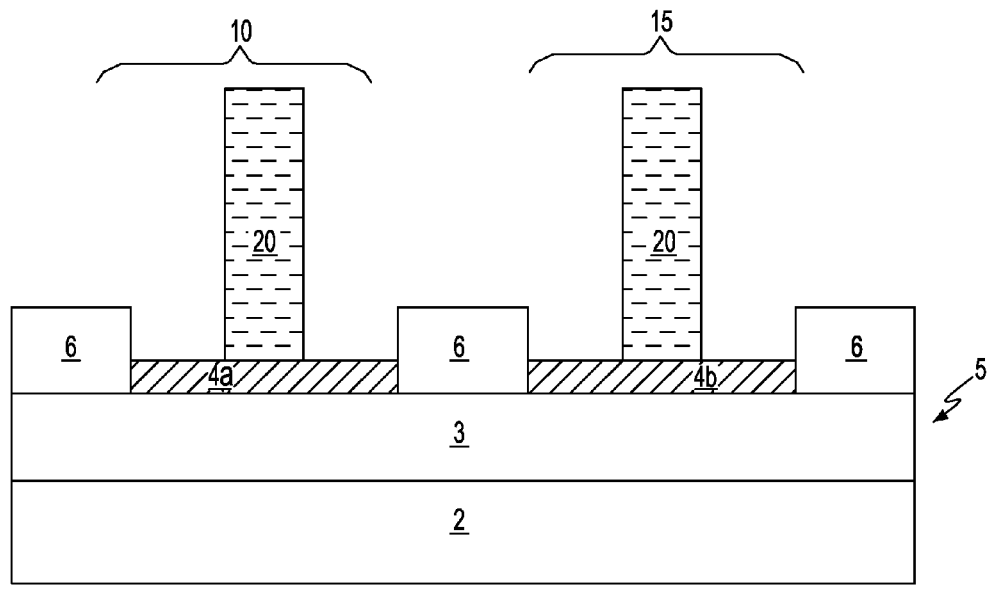
FIG. 1 is a side cross-sectional view depicting an initial structure in accordance with one embodiment of the present method, in which the initial structure includes a semiconductor substrate having a first device region with a first conductivity semiconductor layer and a second device region with a second conductivity semiconductor layer, wherein each of the first device region and the second device region have a replacement gate structure present therein.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention. The following terms have the following meanings, unless otherwise indicated.

As used herein, the term "conductivity type" denotes a dopant region being p-type or n-type.

The term "direct contact" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element.

The embodiments of the present disclosure relate to methods for producing semiconductor devices having raised extension regions present on an upper surface of a semiconductor substrate, and raised source and drain regions that are formed on the raised extension regions. The channel of the device is present in the semiconductor substrate. By forming the raised extension regions on the upper surface of the substrate, a vertical extension is provided. The raised extension regions may be formed using an epitaxial growth process, in which the dopant of the raised extension regions may be introduced by in-situ doping during the epitaxial growth process. In some embodiments, by producing the raised extension regions using the epitaxial growth process and in-situ doping process, the present method does not require that the extension regions be formed by ion implantation. The epitaxial growth process may also precisely control the extension length, which extends in a direction away from the substrate, i.e., vertical direction, in which the plane defined by the direction of the extension length is perpendicular to the upper surface of the substrate. Prior methods that form the extension regions in the semiconductor substrate by ion implantation typically result in uncontrolled lateral diffusion of the extension dopant.

FIGS. 1-7 depict one embodiment of a method for forming a CMOS semiconductor device. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. Complementary metal-oxide-semiconductor (CMOS) device denotes a semiconductor device having complementary pairs of p-type and n-type field effect transistors (FETs). Field effect transistors (FETs) are transistors in which output current, i.e., source-drain current, is controlled by the voltage applied to the gate. Although FIGS. 1-7 depict a method of forming a CMOS semiconductor device having a first type conductivity semiconductor device, e.g., first conductivity field effect transistor, and a second type conductivity semiconductor device, e.g., second conductivity field effect transistor (FET), the methods and structures disclosed herein are equally applicable to singular semiconductor devices of a single conductivity, i.e., n-type or p-type.

FIG. 1 depicts one embodiment of an initial structure as used in accordance with one embodiment of the present method. The initial structure may include a semiconductor substrate 5 having a first device region 10 with a first conductivity first semiconductor layer 4a and a second device region 15 with a second conductivity first semiconductor layer 4b. Each of the first device region 15 and the second device region 20 have a replacement gate structure 20 present therein.

The semiconductor substrate 5 may be a semiconductor on insulator (SOI) substrate, in which the semiconductor substrate 5 includes at least a first semiconductor layer 4a, 4b overlying a dielectric layer 3, wherein the first semiconductor layer 4a, 4b has a thickness of less than 10 nm. A second semiconductor layer 2 may be present underlying the dielectric layer 15. Although the following description is specific to an SOI substrate, the semiconductor substrate 5 may also be a bulk semiconductor substrate.

The first semiconductor layer 4a, 4b may comprise any semiconducting material including, but not limited to Si, strained Si, SiC, SiGe, SiGeC, Si alloys, Ge, Ge alloys, GaAs, InAs, and InP, or any combination thereof. The first semiconductor layer 4a, 4b may be thinned to a desired thickness by planarization, grinding, wet etch, dry etch, oxidation followed by oxide etch, or any combination thereof. One method of thinning the first semiconductor layer 4a, 4b is to oxidize the Si by a thermal dry or wet oxidation process, and then wet etch the oxide layer using a hydrofluoric acid mixture. This process can be repeated to achieve the desired thickness. In one embodiment, the first semiconductor layer 4a, 4b has a thickness ranging from 1.0 nm to 50.0 nm. In another embodiment, the first semiconductor layer 4a, 4b has a thickness ranging from 1.0 nm to 1.0 nm. In a further embodiment, the first semiconductor layer 4 has a thickness ranging from 1.0 nm to 5.0 nm. A first semiconductor layer 4a, 4b that is thinned to a thickness of 10 nm or less may be referred to as an "extremely thin semiconductor on insulator (ETSOI) layer". The second semiconductor layer 2 may be a semiconducting material including, but not limited to Si, strained Si, SiC, SiGe, SiGeC, Si alloys, Ge, Ge alloys, GaAs, InAs, InP as well as other 111/V and II/VI compound semiconductors.

The dielectric layer 3 that may be present underlying the first semiconductor layer 4a, 4b and atop the second semiconductor layer 2 may be formed by implanting a high-energy dopant into the semiconductor substrate 5 and then annealing the structure to form a buried insulating layer, i.e., dielectric layer 3. In another embodiment, the dielectric layer 3 may be deposited or grown prior to the formation of the first semiconductor layer 4a, 4b. In yet another embodiment, the semiconductor substrate 5 may be formed using wafer-bonding techniques, where a bonded wafer pair is formed utilizing glue, adhesive polymer, or direct bonding.

The semiconductor substrate 5 may include isolation regions 6, such as shallow trench isolation (STI) regions. The STI regions are formed by etching a trench in the semiconductor substrate 5 utilizing a dry etching process, such as reactive-ion etching (RIE) or plasma etching. The trenches may optionally be lined with a liner material, e.g., an oxide, and then chemical vapor deposition (CVD) or another like deposition process is used to fill the trench with oxide, nitride, polysilicon or another like STI dielectric material. The STI dielectric may optionally be densified after deposition. A planarization process, such as chemical-mechanical polishing (CMP), may be used to provide a planar structure.

The positioning of the isolation regions 6 typically define the boundaries of the first device region 10 and the second device region 15. The first device region 10 of the semiconductor substrate 5 may include a first semiconductor layer 4a being doped to a first conductivity. In one embodiment, the first conductivity dopant in the first semiconductor layer 4a is present in a concentration as great as 1E15 atoms/$cm^3$, i.e., 0 atoms/$cm^3$ to 1E15 atoms/$cm^3$. In another embodiment, the first conductivity dopant in the first semiconductor layer 4a is present in a concentration ranging from 1E10 atoms/$cm^3$ to 1E21 atoms/$cm^3$. In a further embodiment, the first conductivity dopant in the first semiconductor layer 4a is present in a concentration ranging from 3E20 atoms/$cm^3$ to 6E20 atoms/$cm^3$.

The second device region 15 of the semiconductor substrate 5 may include a first semiconductor layer 4b that is doped to a second conductivity. In one embodiment, the second conductivity dopant in the first semiconductor layer 4b is present in a concentration as great as 1E15 atoms/$cm^3$, i.e., 0 atoms/$cm^3$ to 1E15 atoms/$cm^3$. In another embodiment, the second conductivity dopant in the first semiconductor layer 4b is present in a concentration ranging from 1E20 atoms/$cm^3$ to 1E21 atoms/$cm^3$. In yet another embodiment, the second conductivity dopant in the first semiconductor layer 4b is present in a concentration ranging from 3E20 atoms/$cm^3$ to 6E20 atoms/$cm^3$.

In one embodiment, the first device region 10 may have a first semiconductor layer 4a having a well region of an n-type dopant, in which the first device region 10 will be subsequently be processed to provide p-type source and drain regions. The second device region 15 may have a first semiconductor layer 4b with a well region of a p-type dopant, in which the second device region 15 will be subsequently be processed to provide n-type source and drain regions. P-type dopant refers to the addition of impurities to an intrinsic semiconductor that create deficiencies of valence electrons, such as boron, aluminum, gallium or indium to an intrinsic semiconductor surface comprised of silicon. N-type dopant refers to the addition of impurities that contribute free electrons to an intrinsic semiconductor, such as antimony, arsenic or phosphorous to a semiconducting surface comprised of silicon.

Still referring to FIG. 1, replacement gate structures 20 are then formed atop the first semiconductor layer 4a, 4b in the first device region 10 and the second device region 15. The replacement gate structures 20 are formed by first blanket depositing a layer of replacement gate material using a deposition process, including but not limited to: low pressure chemical vapor deposition or room temperature chemical vapor deposition. The replacement gate material may be any material that can occupy the space in which the subsequently formed functional gate structure is to be positioned. Examples of materials for the replacement gate structures 20 include dielectrics including, but not limited to: oxides, nitrides and oxynitride materials. In one embodiment, the replacement gate structure is composed of silicon nitride. The replacement gate structures 20 may also be formed from semiconductor materials such as polysilicon. Other materials can be employed for the replacement gate structures 20, so long as the replacement gate structure 20 may be removed selectively to the first semiconductor layer 4a, 4b. The replacement gate material may have a thickness ranging from approximately 80.0 nm to approximately 200.0 nm.

The replacement gate structures 20 are then formed from the deposited layer of replacement gate material using conventional photolithography and etching. More specifically, a pattern is produced by applying a photoresist to the surface to be etched; exposing the photoresist to a pattern of radiation; and then developing the pattern into the photoresist utilizing a conventional resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. The replacement gate structures 20 are positioned on a second portion of the first semiconductor layer 4a, 4b. The second portion of the first semiconductor layer 4a, 4b is present between and separating the first portions of the first semiconductor layer 4a, 4b. The first portions of the first semiconductor layer 4a, 4b provide the site for the subsequently formation of the raised extension regions.

Figure 2:
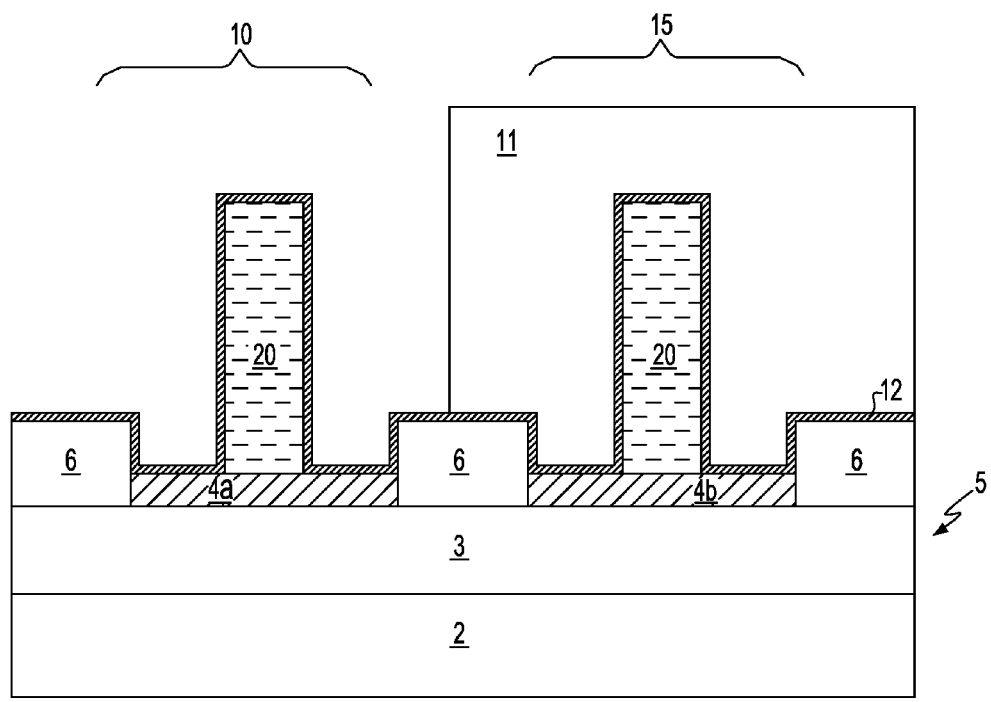
FIG. 2 is a side cross-sectional view depicting forming a first mask on the second device region leaving the first device region exposed, in accordance with one embodiment of the present method.

FIG. 2 depicts forming a first mask 11 on the second device region 15 leaving the first device region 10 exposed. The first mask 11 may comprise soft and/or hardmask materials and can be formed using deposition, photolithography and etching. A photoresist block mask can be produced by applying a photoresist layer to the surface of the semiconductor substrate 5, exposing the photoresist layer to a pattern of radiation, and then developing the pattern into the photoresist layer utilizing a resist developer. Alternatively, the first mask 11 can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to: silsequioxanes, siloxanes, and boron phosphate silicate glass (BPSG). A first mask 11 comprising a hardmask material may be formed by blanket depositing a layer of hardmask material, providing a patterned photoresist atop the layer of hardmask material; and then etching the layer of hardmask material to provide a first mask 11 protecting the second device region 15.

In one embodiment, and prior to forming the first mask 11, a first conformal dielectric layer 12 is formed over the structures within the first device region 15 and the second device region 20. As used herein, "a conformal dielectric layer" is a deposited material having a thickness that remains the same regardless of the geometry of underlying features on which the layer is deposited. The thickness of a conformally deposited dielectric layer varies by no greater than 20% of the average thickness for the layer. In one embodiment, the first conformal dielectric layer 12 is formed in direct contact with the upper and sidewall surfaces of the replacement gate structures 20, the exposed upper surfaces of the first semiconductor layer 4a, 4b, and the exposed surfaces of the isolation regions 6 in the first and second device regions 10, 15.

The first conformal dielectric layer 12 may be an oxide, nitride or oxynitride material. In one example, the first conformal dielectric layer 12 is composed of silicon oxide. The first conformal dielectric layer 12 may be formed using thermal growth or deposition. In one example, the first conformal dielectric layer 12 is deposited using thermal oxidation and is composed of silicon oxide. In another example, the first conformal dielectric layer 12 is formed by a deposition process, such as chemical vapor deposition (CVD). Chemical vapor deposition (CVD) is a deposition process in which a deposited species is formed as a results of chemical reaction between gaseous reactants at an elevated temperature typically being greater than 300° C., wherein solid product of the reaction is deposited on the surface on which a film, coating, or layer of the solid product is to be formed. Variations of CVD processes suitable for the conformal dielectric layer 12 include but are not limited to Atmospheric Pressure CVD (APCVD), Low Pressure CVD (LPCVD) and Plasma Enhanced CVD (EPCVD), Metal-Organic CVD (MOCVD) and others. The thickness of the first conformal dielectric layer 12 is typically from about 1.0 nm to about 10.0 nm. In another embodiment, the first conformal dielectric layer 12 has a thickness that ranges from 2.0 nm to 5.0 nm.

Figure 3:
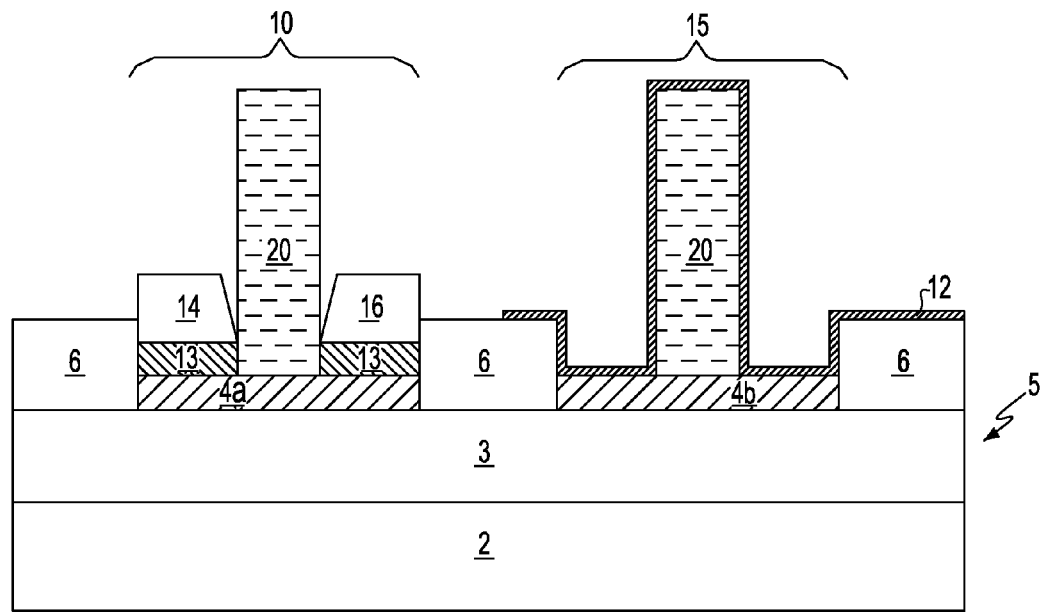
FIG. 3 is a side cross-sectional view depicting forming second conductivity raised extension regions on first portions of the semiconductor substrate in the first device regions, and forming second conductivity raised source regions and second conductivity raised drain regions on the second conductivity raised extension regions, in accordance with one embodiment of the present method.

FIG. 3 depicts forming second conductivity raised extension regions 13 on first portions of the first semiconductor layer 4a in the first device region 10, and forming second conductivity raised source regions 14 and second conductivity raised drain regions 16 on the second conductivity raised extension regions 13. In one embodiment, prior to forming the second conductivity raised extension regions 13, the exposed portion of the first conformal dielectric layer 12 is removed from the first device region 10 by an etch process, while the portion of the first conformal dielectric layer 12 that is present in the second device region 20 is protected by the first mask 11. The etch process is typically a selective etch that removes the first conformal dielectric layer 12 selective to the first mask 11, the replacement gate structure 20 in the first device region 10, the isolation regions 6, and the first semiconductor layer 4a in the first device region 10. In one embodiment, in which the first conformal dielectric layer 12 is composed of silicon oxide, the replacement gate is composed of silicon nitride, the first semiconductor layer is composed of silicon, and first mask 11 is a photoresist material, the etch process may be an HF strip. Once the exposed portion of the first conformal dielectric layer 12 is etched, the first mask 11 may be removed by a chemical strip, oxygen ashing and/or selective etching.

FIG. 3 depicts one embodiment of selectively forming the second conductivity raised extension regions 13 on first portions of the first semiconductor layer 4a in the first device region 10. The first semiconductor layer 4a that is present in the first device region 10 is also doped to the second conductivity. "Selective" as used in combination with the terms formation, growth and/or deposition means that a semiconductor material is formed onto another semiconductor material without being formed on the surrounding insulating areas.

Therefore, in the embodiment depicted in FIG. 3, the remaining portion of the first conformal dielectric layer 12 obstructs the second conductivity raised extension regions 13 from being formed in the second device region 15. The selectively deposited semiconductor may be amorphous, poly-crystalline or single crystal material that is oriented or not orientated with the underlying first semiconductor layer 4a.

The term "raised" as used to describe the second conductivity raised extension regions 13 means that the added semiconductor material has an upper surface that is vertically offset and above the upper surface of the first semiconductor layer 4a, 4b. The first semiconductor layer 4a that is present in the first device region 10 contains the channel region of the subsequently formed device. The channel region is the region that is underlying the gate structure and between the source and drain of the subsequently formed semiconductor device that becomes conductive when the semiconductor device is turned on.

In one embodiment, the second conductivity raised extension regions 13 are composed of epitaxially formed material that is formed in direct contact with the exposed upper surface of the first semiconductor layer 4a. "Epitaxial growth and/or deposition" means the growth of a semiconductor material on a deposition surface of a semiconductor material, in which the semiconductor material being grown has the same crystalline characteristics as the semiconductor material of the deposition surface.

The second conductivity raised extension regions 13 may be composed of a silicon-containing material. In one embodiment, the second conductivity raised extension regions 13 are composed of silicon. The silicon may be single crystal, poly-crystalline or amorphous. The second conductivity raised extension regions 13 may also be composed of a germanium containing material. In one embodiment, the second conductivity raised extension regions 13 are composed of germanium. The germanium may be single crystal, polycrystalline or amorphous. In another example, the second conductivity raised extension regions 13 may be composed of SiGe.

A number of different sources may be used for the selective deposition of silicon. Silicon sources for growth of silicon (epitaxial or poly-crystalline) include silicon tetrachloride, dichlorosilane ($SiH_2Cl_2$), and silane ($SiH_4$). The temperature for epitaxial silicon deposition typically ranges from 550° C. to 900° C. Higher temperature typically results in faster deposition, the faster deposition may result in crystal defects and film cracking The second conductivity raised extension regions 13 may have a thickness ranging from 5 nm to 80 nm, as measured from the upper surface of the first semiconductor layer 4a. In another embodiment, the second conductivity raised extension regions 13 has a thickness ranging from 10 nm to 50 nm, as measured from the upper surface of the first semiconductor layer 4a. In yet another embodiment, the second conductivity raised extension regions 13 has a thickness ranging from 10 nm to 20 nm, as measured from the upper surface of the first semiconductor layer 4a.

The second conductivity raised extension regions 13 have a conductivity that is opposite the conductivity of the first semiconductor layer 4a in the first device region 10. For example, when the first semiconductor layer 4a that is in the first device region 10 is doped with an n-type dopant, the second conductivity raised extension regions 13 are doped with a p-type dopant. The second conductivity raised extension regions 13 may be doped during the deposition process, e.g., epitaxial growth process, using an in-situ doping method.

In one embodiment, p-type semiconductor devices are produced in the first device region 10 by doping the second conductivity raised extension regions 13 with elements from group III of the Periodic Table of Elements. In one embodiment, the group III element is boron, aluminum, gallium or indium. In one embodiment, in which the second conductivity raised extension regions 13 is doped to provide a p-type conductivity, the dopant may be present in a concentration ranging from 1E20 atoms/cm$^3$ to 1E21 atoms/cm$^3$. In another embodiment, in which the second conductivity raised extension regions 13 is doped to provide a p-type conductivity, the dopant may be present in a concentration ranging from 3E20 atoms/cm$^3$ to 6E20 atoms/cm$^3$.

Still referring to FIG. 3, second conductivity raised source and drain regions 14, 16 are then formed in direct contact with the upper surface of the second conductivity raised extension regions 13. The second conductivity raised source and drain regions 14, 16 have the same conductivity type as the second conductivity raised extension regions 13. For example, when the second conductivity raised extension regions 13 have a p-type conductivity, the second conductivity raised source and drain regions 14, 16 have a p-type conductivity. The second conductivity raised source regions 14 and the second conductivity raised drain regions 16 each have a concentration of the second conductivity dopant that is greater than the concentration of second conductivity dopant in the second conductivity raised extension regions 13.

Similar to the second conductivity raised extension regions 13, the second conductivity raised source and drain regions 14, 16 may be formed using a selective deposition process, such as epitaxial growth. A drain region is a doped region in semiconductor device, in which carriers are flowing out of the transistor through the drain. A source region is a doped region in the semiconductor device, in which majority carriers are flowing into the channel region.

The second conductivity raised source and drain regions 14, 16 may be composed of the same or different material as the second conductivity raised extension regions 13. Further, similar to the second conductivity raised extension regions 13, the second conductivity raised source and drain regions 14, 16 may be doped using an in-situ doping process. Therefore, with the exception of the doping concentration of the second conductivity raised source and drain regions 14, 16, the above description for the formation and composition of the second conductivity raised extension regions 13 is applicable to the second conductivity raised source and drain regions 14, 16.

In one embodiment, in which the second conductivity raised source and drain regions 14, 16 is doped to provide a p-type conductivity, the dopant may be present in a concentration ranging from 1E20 atoms/cm$^3$ to 1E21 atoms/cm$^3$. In another embodiment, in which the second conductivity raised source and drain regions 14, 16 is doped to provide a p-type conductivity, the dopant may be present in a concentration ranging from 3E20 atoms/cm$^3$ to 6E20 atoms/cm$^3$. In yet another embodiment, in which the second conductivity raised source and drain regions 14, 16 is doped to provide a p-type conductivity, the dopant may be boron that is present in a concentration ranging from 5E20 atoms/cm$^3$ to 1E21 atoms/cm$^3$.

The second conductivity raised source and drain regions 14, 16 may each have a thickness ranging from 5 nm to 80 nm, as measured from the upper surface of the second conductivity raised extension regions 13. In another embodiment, the second conductivity raised source and drain regions 14, 16 each have a thickness ranging from 10 nm to 50 nm, as measured from the upper surface of the second conductivity raised extension regions 13. In yet another embodiment, the second conductivity raised source and drain regions 14, 16 each have a thickness ranging from 10 nm to 20 nm, as measured from the upper surface of the second conductivity raised extension regions 13.

Figure 4:
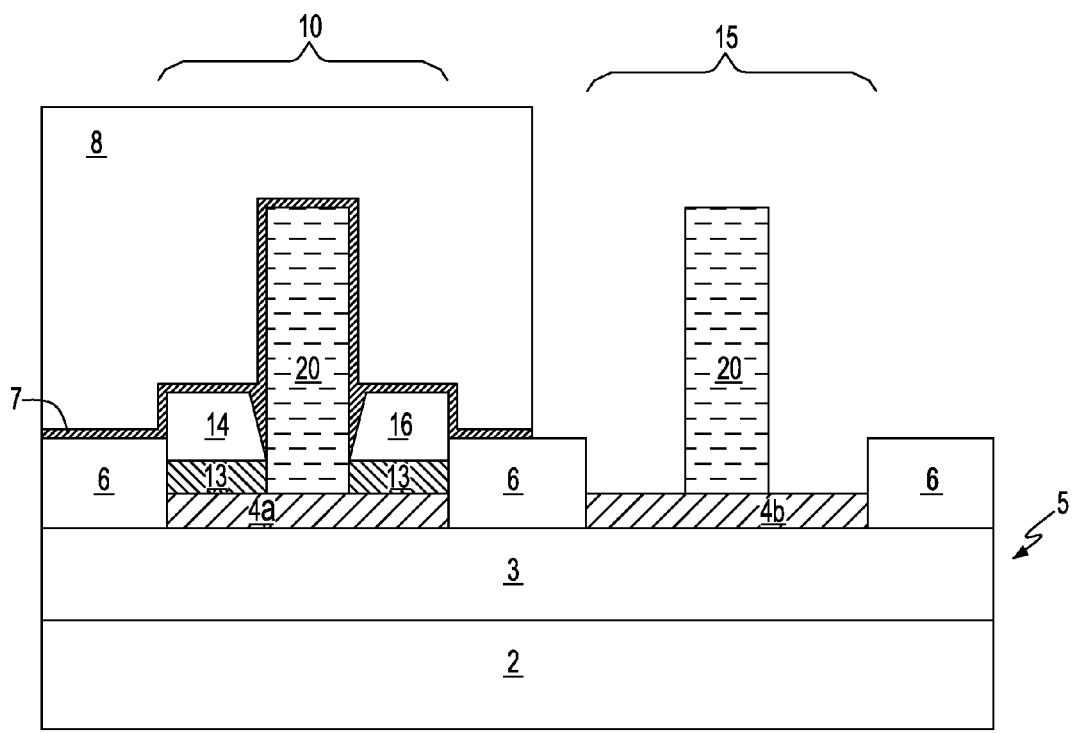
FIG. 4 is a side cross-sectional view depicting forming a second mask on the first device region leaving the second device region exposed, in accordance with one embodiment of the present method.

The second conductivity raised source and drain regions 14, 16 may each have a tapered portion that extends from the sidewall of the replacement gate structure 20. The thickness of the tapered portion of the second conductivity raised source and drain regions 14, 16 increases in the lateral direction away from the replacement gate structure FIG. 4 depicts removing the remaining portion of the first conformal dielectric layer 12 from the second device region 15, and forming a second mask 8 on the first device region 10. The second mask 8 leaves the second device region 15 exposed. In one embodiment, prior to removing the remaining portion of the first conformal dielectric layer 12 and forming the second mask 8, a second conformal dielectric layer 7 is formed over the structures within the first device region 15 and the second device region 20. The second conformal dielectric layer 7 may be formed in direct contact with the upper and sidewall surfaces of the replacement gate structures 20, the remaining portion of the first conformal dielectric layer 12, the exposed upper surfaces of the first semiconductor layer 4a in the first device region 10, and the exposed surfaces of the isolation regions 6.

The second conformal dielectric layer 7 may be an oxide, nitride or oxynitride material. In one example, the second conformal dielectric layer 7 is composed of silicon oxide. The second conformal dielectric layer 7 may be formed using thermal growth or deposition processed. In one example, the second conformal dielectric layer 7 is deposited using thermal oxidation and is composed of silicon oxide. The thickness of the second conformal dielectric layer 7 is typically from about 1.0 nm to about 10.0 nm. In another embodiment, the second conformal dielectric layer 7 has a thickness that ranges from 2.0 nm to 5.0 nm. The second conformal dielectric layer 7 is similar in composition and method of manufacturing as the first conformal dielectric layer 12.

The above description for the formation and composition of the first conformal dielectric layer 12 is applicable to the second conformal dielectric layer 7.

Following the formation of the second conformal dielectric layer 7, the second mask 8 is formed atop the first device region 10. The second mask 8 is similar in composition and method of manufacturing as the first mask 11. The above description for the formation and composition of the first mask 11 is applicable to the second mask 8. The second mask 8 does not cover the second device region 15.

An etch process removes the second conformal dielectric layer 7 and the remaining portion of the first conformal dielectric layer 12 from the second device region 15. The etch process may be a selective etch process, in which the exposed portion of the second conformal dielectric layer 7 and the remaining portion of the first conformal dielectric layer 12 that is present in the second device region 15 is removed selective to the second mask 8. The etch process that removes the exposed portion of the second conformal dielectric layer 7 and the remaining portion of the first conformal dielectric layer 12 exposes the upper surface of the first semiconductor layer 4b that is present in the second device region 15. A portion of the second conformal dielectric layer 7 that is present underlying the second mask 8 remains within the first device region 10. Once the first semiconductor layer 4b that is present in the second device region 15 is exposed, the second mask 8 may be removed by a chemical strip, oxygen ashing and/or selective etching.

Figure 5:
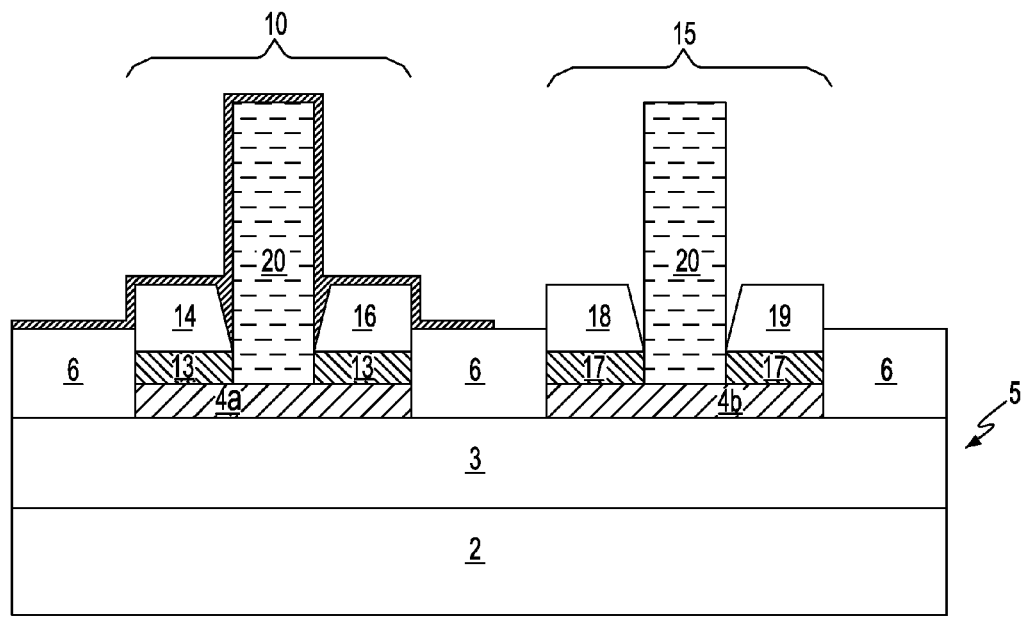
FIG. 5 is a side cross-sectional view depicting forming first conductivity raised extension regions on first portions of the semiconductor substrate in the second device region, forming first conductivity raised source regions and first conductivity raised drain regions on the first conductivity raised extension regions, and removing the second mask, in accordance with one embodiment of the present method.

FIG. 5 depicts forming first conductivity raised extension regions 17 on first portions of the first semiconductor layer 4b, in the second device region 15. The first semiconductor layer 4b that is present in the second device region 15 is doped to a second conductivity. In one embodiment, the first conductivity raised extension regions 17 are selectively deposited on the first portions of the first semiconductor layer 4b of the second conductivity in the second device region 15, in which the first conductivity raised extension regions 17 are not formed in the first device region 10. Therefore, the remaining portion of the second conformal dielectric layer 7 obstructs the first conductivity raised extension regions 17 from being formed in the first device region 10. The selectively deposited semiconductor may be amorphous, poly-crystalline or single crystal material that is oriented or not orientated with the underlying first semiconductor layer 4b.

In one embodiment, the first conductivity raised extension regions 17 is composed of epitaxially formed material that is formed in direct contact with the exposed upper surface of the first semiconductor layer 4b. The first conductivity raised extension regions 17 may be composed of a silicon-containing material, which may be a single crystal, polycrystalline or amorphous material. The first conductivity raised extension regions 17 may also be composed of silicon that is doped with carbon (Si:C). A number of different sources may be used for the selective deposition of silicon. Silicon sources for growth of silicon (epitaxial or poly-crystalline) include silicon tetrachloride, dichlorosilane ($SiH_2Cl_2$), and silane ($SiH_4$). The temperature for epitaxial silicon deposition typically ranges from 550° C. to 900° C. Higher temperature typically results in faster deposition, the faster deposition may result in crystal defects and film cracking The first conductivity raised extension regions 17 may have a thickness ranging from 5 nm to 80 nm, as measured from the upper surface of the first semiconductor layer 4b. In another embodiment, the first conductivity raised extension regions 17 has a thickness ranging from 10 nm to 50 nm, as measured from the upper surface of the first semiconductor layer 4b. In yet another embodiment, the first conductivity raised extension regions 17 has a thickness ranging from 10 nm to 20 nm, as measured from the upper surface of the first semiconductor layer 4b.

The first conductivity raised extension regions 17 have a conductivity that is opposite the first semiconductor layer 4b, i.e., second conductivity first semiconductor layer, in the second device region 15. For example, when the first semiconductor layer 4b that is in the second device region 15 is doped with a p-type dopant, the first conductivity raised extension regions 17 are doped with an n-type dopant. The first conductivity raised extension regions 17 may be doped during the deposition process, e.g., epitaxial growth process, using an in-situ doping method.

In one embodiment, n-type semiconductor devices are produced in the second device region 15 by doping the first conductivity raised extension regions 17 with elements from group V of the Periodic Table of Elements. In one embodiment, the group V element is phosphorus, arsenic, antimony or a combination thereof. In one embodiment, in which the first conductivity raised extension regions 17 are doped to provide an n-type conductivity, the dopant may be present in a concentration ranging from 1E20 atoms/$cm^3$ to 1E21 atoms/$cm^3$. In another embodiment, in which the first conductivity raised extension regions 17 are doped to provide an n-type conductivity, the dopant may be present in a concentration ranging from 3E20 atoms/$cm^3$ to 6E20 atoms/$cm^3$. In yet another embodiment, in which the first conductivity raised extension regions 17 is doped to provide an n-type conductivity, the dopant may be phosphorus that is present in a concentration ranging from 5E20 atoms/$cm^3$ to 1E21 atoms/$cm^3$.

Still referring to FIG. 5, first conductivity raised source and drain regions 18, 19 are formed in direct contact with the upper surface of the first conductivity raised extension regions 17. The first conductivity raised source and drain regions 18, 19 have the same conductivity type as the first conductivity raised extension regions 17. For example, when the first conductivity raised extension regions 17 have an n-type conductivity, the first conductivity raised source and drain regions 18, 19 have an n-type conductivity. The first conductivity raised source regions 18 and the first conductivity raised drain regions 19 each have a concentration of the first conductivity dopant that is greater than the concentration of first conductivity dopant in the first conductivity raised extension regions 17.

Similar to the first conductivity raised extension regions 17, the first conductivity raised source and drain regions 18, 19 may be formed using a selective deposition process, such as epitaxial growth. The first conductivity raised source and drain regions 18, 19 may be composed of the same or different material as the first conductivity raised extension regions 17. Further, similar to the first conductivity raised extension regions 17, the first conductivity raised source and drain regions 18, 19 may be doped using an in-situ doping process. Therefore, with the exception of the doping concentration of the first conductivity raised source and drain regions 18, 19, the above description for the formation and composition of the first conductivity raised extension regions 17 is applicable to the first conductivity raised source and drain regions 18, 19.

In one embodiment, in which the first conductivity raised source and drain regions 18, 19 are doped to provide an n-type conductivity, the dopant may be present in a concentration ranging from 1E20 atoms/$cm^3$ to 1E21 atoms/$cm^3$. In another embodiment, in which the first conductivity raised source and drain regions 18, 19 are doped to provide an n-type conductivity, the dopant may be present in a concentration ranging from 3E20 atoms/$cm^3$ to 6E20 atoms/$cm^3$. In yet another embodiment, in which the first conductivity raised source and drain regions 18, 19 are doped to provide an n-type conductivity, the dopant may be phosphorus that is present in a concentration ranging from 5E20 atoms/$cm^3$ to 1E21 atoms/$cm^3$.

The first conductivity raised source and drain regions 18, 19 may each have a thickness ranging from 5 nm to 80 nm, as measured from the upper surface of the first conductivity raised extension regions 17. In another embodiment, the first conductivity raised source and drain regions 18, 19 each have a thickness ranging from 10 nm to 50 nm. In yet another embodiment, the first conductivity raised source and drain regions 18, 19 each have a thickness ranging from 10 nm to 20 nm. Similar to the second conductivity raised source and drain regions 14, 16, the first conductivity raised source and drain regions 18, 19 may each have a tapered portion that extends from the sidewall of the replacement gate structure 20.

Figure 6:
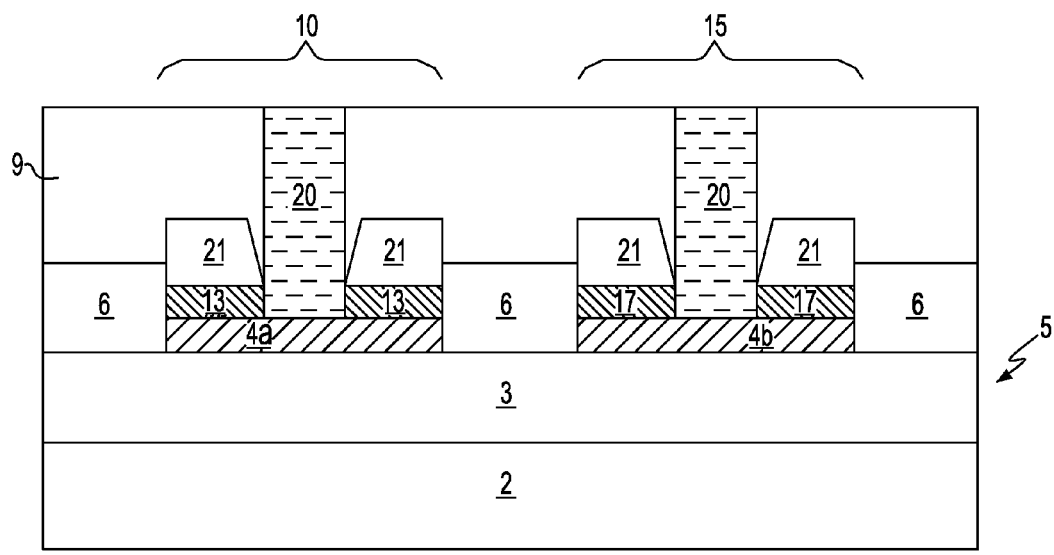
FIG. 6 is side cross-sectional view depicting forming a dielectric material having an upper surface that is coplanar with the replacement gate structures, in accordance with one embodiment of the present method.

FIG. 6 depicts forming a dielectric material 9 having an upper surface that is coplanar with the replacement gate structures 20. In one embodiment, prior to forming the dielectric material 9, metal semiconductor alloy regions 21 may be formed on the first conductivity raised source and drain regions 18, 19 and the second conductivity raised source and drain regions 14, 16. In one embodiment, the metal semiconductor alloy is a silicide. Silicide formation typically requires depositing a refractory metal, such as cobalt, nickel, or titanium onto the surface of a silicon-containing material. Following deposition, the structure is subjected to an annealing process, such as rapid thermal annealing. During thermal annealing, the deposited metal reacts with the silicon forming a silicide. The remaining unreacted metal is removed by a selective etch process.

A layer of dielectric material 9 can be blanket deposited atop the entire semiconductor substrate 5 and planarized. Planarization is a material removal process that employs at least mechanical forces, such as frictional media, to produce a planar surface. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the blanket dielectric include: any of the aforementioned materials in porous form, or in a form that changes during processing to or from being porous and/or permeable to being non-porous and/or non-permeable.

The planarization of the dielectric material 9 may be continued until the upper surface of the replacement gate structures 20 are exposed, and the upper surface of the planarized dielectric material 9 is coplanar with the upper surface of the replacement gate structures 20. In one embodiment, the planarization process is provided by chemical mechanical planarization (CMP). Chemical Mechanical Planarization (CMP) is a material removal process using both chemical reactions and mechanical forces to remove material and planarize a surface.

Figure 7:
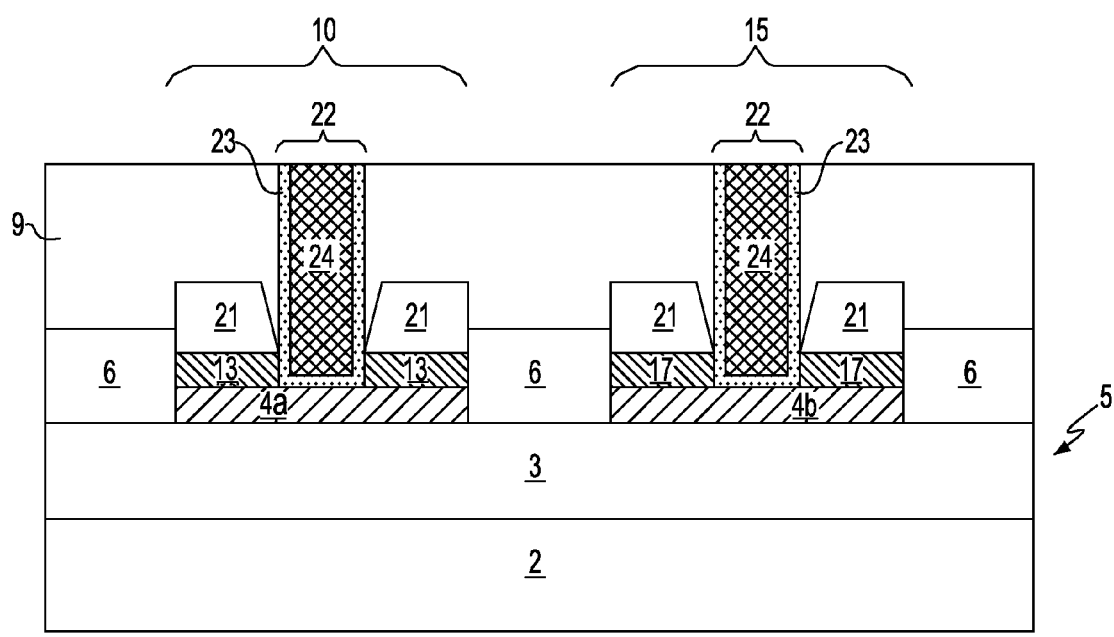
FIG. 7 is a side cross-sectional view depicting removing the replacement gate structures to provide an opening though the dielectric material to second portions of the semiconductor substrate that are between the first portions of the semiconductor substrate in the first device region and the second device region, and forming gate structures in the openings to the second portions of the semiconductor substrate, in accordance with one embodiment of the present method.

FIG. 7 depicts removing the replacement gate structures 20 to provide an opening though the dielectric material 9 to second portions of the semiconductor substrate 5 in each of the first device region 10 and the second device region 15. The replacement gate structures 20 may be removed using a selective etch process. In one embodiment, in which the replacement gate structures 20 are composed of silicon nitride and the dielectric material 9 is composed of silicon oxide, selective removal of the replacement gate structures 20 is achieved via a wet etch procedure. In one example, the wet etch procedure may include a hot phosphoric acid solution that selectively removes the silicon nitride replacement gate structure 20 without etching the silicon oxide dielectric material 9. This procedure results in an opening, or space, that exposes the second portion of the first semiconductor layer 4a, 4b in the first device region 10 and the second device region 15. The removal of replacement gate structures 20 does not result in significant attack or removal of the first semiconductor layer 4a, 4b in the first device region 10 and the second device region 15 that provides the channel region of the device being formed.

FIG. 7 further depicts forming functional gate structures 22 in the openings to the second portions of the first semiconductor layer 4a, 4b in the first device region 10 and the second device region 15 of the semiconductor substrate 5. As used herein, a functional gate structure 22 is used to control output current (i.e., flow of carriers in the channel) of a semiconducting device through electrical or magnetic fields. Typically, the functional gate structure 22 includes at least one gate conductor 24 and at least one gate dielectric 23.

The gate dielectric 23 may be a dielectric material, such as $SiO_2$, or alternatively high-k dielectrics, such as oxides of Hf, Ta, Zr, Al or combinations thereof. A "high-k" dielectric is a dielectric or insulating material having a dielectric constant that is greater than the dielectric constant of silicon oxide. High-k dielectrics have a dielectric constant greater than the dielectric constant of $SiO_2$, e.g., greater than 4.0. In another embodiment, the gate dielectric 23 is comprised of an oxide, such as $HfO_2$, $SiO_2$, $ZrO_2$, $Ta_2O_5$ or $Al_2O_3$. In one embodiment, the gate dielectric 23 has a thickness ranging from 1 nm to 10 nm. In another embodiment, the gate dielectric 23 has a thickness ranging from 1.5 nm to 2.5 nm.

The gate dielectric 23 may be formed using a deposition or growth process. In one embodiment, the gate dielectric 23 is deposited using a conformal deposition process, such as chemical vapor deposition (CVD), e.g., plasma enhanced chemical vapor deposition (PECVD). In one embodiment, the gate dielectric 23 is formed on the base of the opening, i.e., the second portion of the first semiconductor layer 4a, 4b, and the sidewalls of the opening that is provided by the dielectric material 9 in each of the first and second device regions 10, 15. The gate dielectric 23 may also be formed on the upper surface of the dielectric material 9. The portion of the gate dielectric 23 that is formed on the upper surface of the dielectric material 9 may be removed by a planarization or etch process.

A gate conductor 24 may be formed atop the gate dielectric 23. The gate conductor 24 may fill the openings in the first device region 10 and the second device region 15 that are formed by removing the replacement gate structure 20. The gate conductor 24 may be formed using physical deposition methods, such as plating and sputtering. The gate conductor 24 may also be deposited using chemical vapor deposition (CVD).

The gate conductor 24 may be composed of any conductive material including but not limited to: polysilicon; a conductive elemental metal such as W, Cu, Pt, Ag, Al, Au, Ru, Ir, Rh, Ti, Ta and Re; alloys that include at least one of the aforementioned conductive elemental metals; silicides or nitrides that include at least one of the above-mentioned conductive elemental metals; and combinations thereof. When a combination of conductive elements is employed in the gate conductor 24, an optional diffusion barrier material such as TaN or WN may be formed between the conductive materials. The gate conductor 24 may also be composed of low resistivity intermetallics. In one embodiment, the gate conductor 24 may be a doped semiconductor material, such as a doped silicon-containing material, e.g., doped polysilicon. In some examples, the gate conductor 24 is doped with an n-type or p-type dopant.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
   providing a semiconductor substrate doped with a first conductivity dopant, said semiconductor substrate having first portions separated by a second portion present therebetween;
   forming raised extension regions on the first portions of the semiconductor substrate, wherein the raised extension regions have a first concentration of a second conductivity dopant;

forming raised source regions and raised drain regions on the raised extension regions, the raised source regions and the raised drain regions each having a second concentration of the second conductivity dopant, wherein the second concentration is greater than the first concentration; and forming a gate structure on the second portion of the semiconductor substrate, the gate structure including a gate dielectric layer that is positioned between the semiconductor substrate and a base of a gate conductor, wherein the gate dielectric layer is also present on sidewalls of the gate conductor, wherein an inner edge of the raised extension regions is in contact with the gate dielectric layer that is present on the sidewalls of the gate conductor that provides a sidewall of the gate structure and an inner edge of the raised source regions and the raised drain regions is in contact with the gate dielectric layer that is present on the sidewalls of the gate conductor that provides the sidewall of the gate structure so that the inner edge of the raised source regions and the raised drain regions is aligned to the inner edge of the raised extension regions.

2. The method of claim 1, wherein the first conductivity dopant is one of an n-type or p-type dopant, and the second conductivity dopant is an other of the n-type or the p-type dopant.

3. The method of claim 1, wherein the first conductivity dopant in the semiconductor substrate is present in a concentration ranging from 0 atoms/cm$^3$ to 1E15 atoms/cm$^3$.

4. The method of claim 1, wherein the forming of the gate structure comprises:

forming a replacement gate structure on the second portion of the semiconductor substrate before the forming of the raised extension regions on the first portions of the semiconductor substrate;

forming a dielectric material having an upper surface coplanar with the replacement gate structure after the forming of the raised source regions and the raised drain regions on the raised extension regions;

removing the replacement gate structure to provide an opening though the dielectric material to the second portion of the semiconductor substrate;

forming the gate dielectric layer on the second portion of the semiconductor substrate and sidewall of the dielectric material;

filling the opening with the gate conductor; and removing the dielectric material.

5. The method of claim 4, wherein the forming the gate dielectric layer comprises depositing a conformal dielectric layer.

6. The method of claim 1, wherein the forming of the raised extension comprises epitaxial growth of an extension semiconductor material.

7. The method of claim 6, wherein the second conductivity dopant that is present in the raised extension regions is introduced by in-situ doping during the epitaxial growth or by ion implantation following the epitaxial growth process that provides the extension semiconductor material or a combination thereof.

8. The method of claim 1, wherein the first concentration of the second conductivity dopant in the raised extension regions ranges from 1E20 atoms/cm$^3$ to 1E21 atoms/cm$^3$.

9. The method of claim 1, wherein the forming of the raised source regions and the raised drain regions comprise epitaxial growth of a source and drain semiconductor material.

10. The method of claim 9, wherein the second conductivity dopant that is present in the source and drain semiconductor material is introduced by in-situ doping during the epitaxial growth.

11. The method of claim 1, wherein the second concentration of the second conductivity dopant in the source regions and drain regions ranges from 1E20 atoms/cm$^3$ to 1E21 atoms/cm$^3$.

12. A method for forming a CMOS semiconductor device comprising:

providing a semiconductor substrate doped with a first conductivity dopant in a first device region and doped with a second conductivity dopant in a second device region;

forming a first mask on the second device region, wherein the first device region exposed;

forming second conductivity raised extension regions on a first portion of the semiconductor substrate in the first device region, said second conductivity raised extension regions have a first concentration of second conductivity dopant;

forming second conductivity raised source regions and second conductivity raised drain regions on the second conductivity raised extension regions, wherein the second conductivity raised source regions and the second conductivity raised drain regions each have a second concentration of the second conductivity dopant that is greater than the first concentration of the second conductivity dopant in the second conductivity raised extension regions, wherein an inner edge of the second conductivity raised source regions and the second conductivity raised drain regions is aligned to an inner edge of the second conductivity raised extension regions;

removing the first mask and forming a second mask on the first device region leaving the second device region exposed;

forming first conductivity raised extension regions on a first portion of the semiconductor substrate in the second device region, said first conductivity raised extension regions have a third concentration of first conductivity dopant;

forming first conductivity raised source regions and first conductivity raised drain regions on the first conductivity raised extension regions, the first conductivity raised source regions and the first conductivity raised drain regions each having a fourth concentration of the first conductivity dopant that is greater than the third concentration of first conductivity dopant in the first conductivity raised extension regions, wherein an inner edge of the first conductivity raised source regions and the first conductivity raised drain regions is aligned to an inner edge of the first conductivity raised extension regions; and forming gate structures on second portions of the semiconductor substrate that are between the first portion of the semiconductor substrate in the first device region and the second device region.

13. A semiconductor device comprising:

a semiconductor substrate including at least one surface having a first conductivity type;

a gate structure present on the at least one surface of the semiconductor substrate, wherein the gate structure includes a gate dielectric layer that is positioned between the semiconductor substrate and a base of a gate conductor, wherein the gate dielectric layer is also present on sidewalls of the gate conductor;

raised extension regions of a second conductivity type present on a portion of the semiconductor substrate that is adjacent to the gate structure, wherein the raised extension regions have a first dopant concentration, wherein an inner edge of the raised extension regions contacts the gate dielectric layer that is present on the sidewalls of the gate conductor; and raised source regions and raised drain regions of a second conductivity type present on the raised extension regions, wherein the raised source regions and raised drain regions have a second dopant concentration that is greater than the first dopant concentration, wherein an inner edge of the raised source regions and the raised drain regions is aligned with the inner edge of the raised extension regions.

14. The semiconductor device of claim 13, wherein the first conductivity type is an n-type conductivity and the second conductivity type is a p-type conductivity, or the first conductivity type is a p-type conductivity and the second conductivity type is an n-type conductivity.

15. The semiconductor device of claim 13, wherein the raised extension regions have a thickness ranging from 1 nm to 10 nm, as measured from an upper surface of the semiconductor surface.

16. The semiconductor device of claim 13, wherein the raised source regions and the raised drain regions have a thickness as great as 20 nm, as measured from an upper surface of the raised extension regions.

* * * * *